(12) United States Patent
Alptekin et al.

(10) Patent No.: US 8,647,954 B2
(45) Date of Patent: Feb. 11, 2014

(54) TWO-STEP SILICIDE FORMATION

(71) Applicant: International Business Machines Corporation, Armonk, NY (US)

(72) Inventors: Emre Alptekin, Fishkill, NY (US); Sameer H. Jain, Ossining, NY (US); Reinaldo A. Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/937,698

(22) Filed: Jul. 9, 2013

(65) Prior Publication Data

US 2013/0295765 A1 Nov. 7, 2013

Related U.S. Application Data

(63) Continuation of application No. 13/039,678, filed on Mar. 3, 2011.

(51) Int. Cl.
*H01L 21/336* (2006.01)
*H01L 21/3205* (2006.01)

(52) U.S. Cl.
USPC .......................................... 438/300; 438/592

(58) Field of Classification Search
USPC .................... 438/300, 585, 587, 588, 592; 257/E21.619, E21.634, E23.01
See application file for complete search history.

(56) References Cited

U.S. PATENT DOCUMENTS

| | | | |
|---|---|---|---|
| 5,646,070 A * | 7/1997 | Chung | ........................... 438/644 |
| 5,994,191 A | 11/1999 | Xiang et al. | |
| 6,774,023 B1 | 8/2004 | Paek et al. | |
| 6,878,623 B2 | 4/2005 | Tan et al. | |
| 6,989,322 B2 | 1/2006 | Gluschenkov et al. | |
| 7,211,515 B2 | 5/2007 | Lee et al. | |
| 7,473,975 B2 | 1/2009 | Biery et al. | |
| 7,662,716 B2 | 2/2010 | Kim et al. | |
| 7,737,032 B2 | 6/2010 | Chan et al. | |
| 7,863,192 B2 | 1/2011 | Frank et al. | |
| 2002/0137268 A1 * | 9/2002 | Pellerin et al. | ................. 438/197 |
| 2010/0276761 A1 | 11/2010 | Tung et al. | |
| 2012/0112292 A1 | 5/2012 | Lavoie et al. | |
| 2012/0181697 A1 | 7/2012 | Lavoie et al. | |
| 2012/0223372 A1 * | 9/2012 | Alptekin et al. | ............... 257/288 |

FOREIGN PATENT DOCUMENTS

CN 1645594 A 7/2005

OTHER PUBLICATIONS

Li et al., "Novel Schottky barrier MOSFET with dual-layer silicide source/drain structure"; Proceedings of Solid-State and Integrated Circuits Technology; 2004; vol. 1; pp. 6-72; Oct. 18-21, 2004.
Non Final Office Action (Requirement for Restriction/Election) for U.S. Appl. 13/039,678 dated Dec. 11, 2012.

(Continued)

*Primary Examiner* — Hung Vu
(74) *Attorney, Agent, or Firm* — Jason H. Sosa

(57) ABSTRACT

One embodiment of the present invention comprises a transistor having a source/drain region within a substrate, an extension region within the substrate adjoining the source/drain region and extending toward a gate on the substrate, and a dielectric spacer against the gate wherein the dielectric spacer covers at least part of the extension region. A silicide intermix layer is formed over both the source/drain region and a portion of the extension region. A silicide contact is formed through the silicide intermix layer over the source/drain region.

6 Claims, 6 Drawing Sheets

(56) References Cited

OTHER PUBLICATIONS

Response to Non Final Office Action (Requirement for Restriction/Election) for U.S. Appl. No. 13/039,678 filed Dec. 18, 2012.

Non Final Office Action for U.S. Appl. No. 13/039,678 dated Apr. 26, 2013.

Response to Non Final Office Action for U.S. Appl. No. 13/039,678 filed Jun. 28, 2013.

U.S. Appl. No. 13/767,088 entitled "Two-Step Silicide Formation" filed Feb. 14, 2013.

* cited by examiner

TWO-STEP SILICIDE FORMATION

CROSS REFERENCE TO RELATED APPLICATION

This application is a continuation of application Ser. No. 13/039,678, filed on Mar. 3, 2011, now pending.

FIELD OF THE INVENTION

This disclosure relates generally to semiconductor devices and more specifically to a two-step silicide formation process to reduce parasitic source/drain resistance and parasitic gate-to-source/drain capacitance.

BACKGROUND

A typical semiconductor transistor device comprises a gate, which has a conductive element stacked onto a dielectric layer on a semiconductor substrate, and doped regions within the substrate on either side of the gate. The dielectric layer is typically an oxide and is often referred to as the gate oxide. One doped region is referred to as a source, the other as a drain, indicating the direction of current flow. Other than where current is applied, these doped regions are similar in all other respects, and hence a doped region may be referred to as a source/drain region, as it could be either the source or the drain depending on implementation. Also common in semiconductor devices, adjoining a source/drain region, is another similarly doped region extending the source/drain region towards the gate. This other region is commonly referred to as the extension region and is shallower than the source/drain region.

As the size of integrated circuits (ICs) decrease, parasitic resistance and capacitance may be increased due to the smaller sizes and closer proximity of contacts within a semiconductor device. A contact is the electrical connection between an active region within the device, e.g., a source/drain region or gate, and a metal layer. Silicide (metal-silicon compounds) contacts have become increasingly important to reduce electrical resistance. By increasing contact of a silicide layer with a source/drain region, resistance may be lowered further. However, in semiconductor devices with conventional silicides, the closer such contacts get to a gate, the higher the likelihood of increased parasitic gate-to-source, or gate-to-drain, capacitance. The reason has to do with junction leakage. As the silicide is pushed closer to the gate, it is also pushed closer to the source/body and drain/body junctions, resulting in higher trap-assisted junction leakage due to metal diffusion from a silicide that has finite thermal stability. To keep junction leakage low, the silicide-to-junction proximity must not fall below some threshold value, which means that moving a conventional silicide closer to the gate requires making the source/drain junctions deeper both laterally and vertically. Therefore, the gate-to-source/drain capacitance increases and the placement, type, and structure of silicide layer(s) may become a compromise between parasitic source/drain resistance and parasitic gate-to-source/drain capacitance.

SUMMARY

One aspect of the invention includes a method for forming a semiconductor device. The method comprises forming a transistor comprising a source/drain region within a substrate, an extension region within the substrate adjoining the source/drain region and extending toward a gate on the substrate, and a dielectric spacer against the gate wherein the dielectric spacer covers at least part of the extension region. The method further comprises forming a silicide intermix layer over both the source/drain region and a portion of the extension region not covered by the dielectric spacer. The method further comprises depositing dielectric material over the silicide intermix layer on top of the source/drain region. Then, creating a contact opening through the dielectric material, wherein the contact opening extends at least as far as the silicide intermix layer over the source/drain region. The method then comprises forming a silicide contact at the bottom of the contact opening.

In another aspect of the invention a semiconductor device comprises a transistor comprising a source/drain region within a substrate, an extension region within the substrate adjoining the source/drain region and extending toward a gate on the substrate, and a dielectric spacer against the gate wherein the dielectric spacer covers at least part of the extension region. The semiconductor device further comprises a silicide intermix layer over both the source/drain region and a portion of the extension region. The semiconductor device also comprises a silicide contact formed through the silicide intermix layer over the source/drain region.

In yet another aspect of the invention a semiconductor device comprises a transistor comprising a source/drain region comprising a portion within a substrate and portion raised above the substrate, an extension region within the substrate adjoining the source/drain region and extending toward a gate on the substrate, and a dielectric spacer against the gate wherein the dielectric spacer covers at least part of the extension region. The semiconductor device further comprises a silicide contact recessed into the raised source/drain region, and a silicide intermix layer extending from a side of the silicide contact, down over a vertical side of the raised portion of the source/drain region, and over a portion of the extended region.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Figure 1:
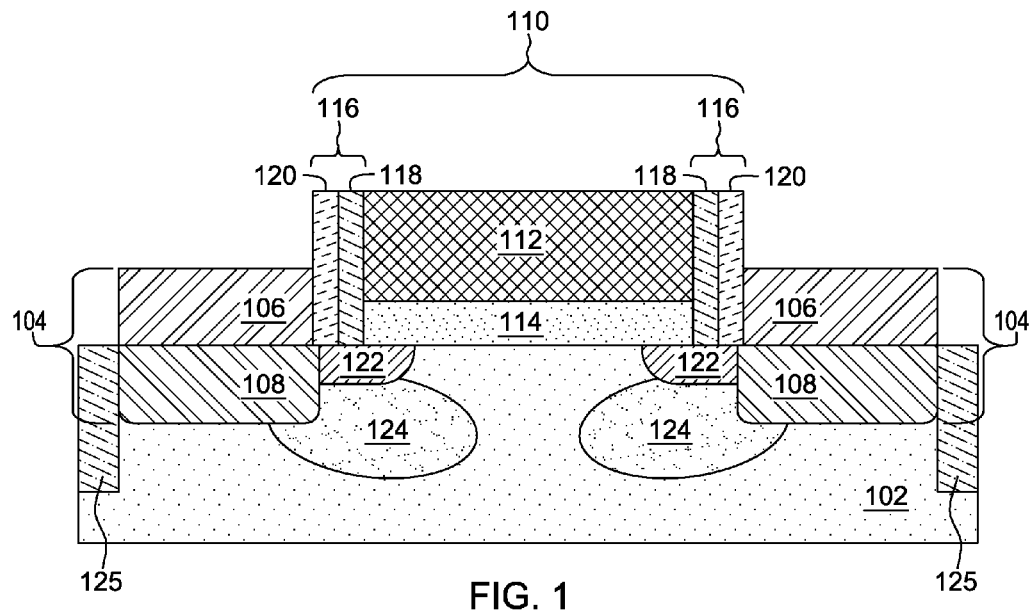
FIG. 1 depicts a semiconductor device upon which a two-step silicide formation may be performed, in accordance with an illustrative embodiment.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

FIG. 1 depicts one embodiment of a semiconductor device upon which a two-step silicide formation may be formed. Semiconductor substrate 102 has source/drain regions 104 on opposite sides of a gate structure 110.

In a preferred embodiment, as depicted, source/drain regions, such as source drain regions 104, are raised source/drain regions wherein a portion of the region rises out of semiconductor substrate 102, such as raised portion 106, and a second portion of the region resides within semiconductor substrate 102, such as embedded portion 108.

Gate structure 110 overlies the semiconductor substrate 102. Gate structure 110 includes a gate comprising conductor 112 and gate oxide 114, and at least one dielectric spacer 116 per side in direct contact with a sidewall of the gate (the stacked conductor 112 and gate oxide 114). In a preferred embodiment each spacer 116 comprises inner spacer 118 and outer spacer 120. In one embodiment, spacers 116 may be formed by using a blanket layer deposition, such as chemical vapor deposition, and an anisotropic etch back method. Spacers 116 typically have a width ranging from 2.0 nm to 15.0 nm, and may be composed of a dielectric, such as a nitride, oxide, oxynitride, or a combination thereof.

Extension regions 122 adjoin source/drain regions 104 and extend beneath gate structure 110. The portion of semiconductor substrate 102 that is beneath gate structure 110 is the channel region of semiconductor substrate 102. The channel region of semiconductor substrate 102 is the region between source/drain regions 104, and may be shortened by extension regions 122. The channel region becomes conductive when the semiconductor device, e.g., a field effect transistor, is turned on. Source/drain regions 104 and extension regions 122 are doped regions in the semiconductor device, in which majority carriers may flow into and out of the channel region.

Semiconductor substrate 102 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. Semiconductor substrate 102 may also be composed of other semiconductor materials, such as germanium, and compound semiconductor substrates, such as type III/V semiconductor substrates, e.g., GaAs. Although semiconductor substrate 102 is depicted as a bulk semiconductor substrate, semiconductor on insulator (SOI) substrate arrangements, such as silicon on insulator substrates, are also suitable for semiconductor substrate 102.

In a preferred embodiment, within semiconductor substrate 102, halo doping regions 124 may be used. Halo doping regions 124 are thin, heavily doped regions of the same doping type as semiconductor substrate 102, tight against junction walls to limit the extent of depletion regions.

Also in a preferred embodiment dielectric trench isolation, such as isolation regions 125, may be used. Isolation regions 125 are filled with one or more dielectric materials. This prevents electrical current leakage between adjacent semiconductor device components. It may also prevent a silicide contact from shorting to the semiconductor substrate. In various embodiments, isolation regions 125 may be at varying depths to form embodiments of shallow trench isolation or deep trench isolation.

Figure 2:
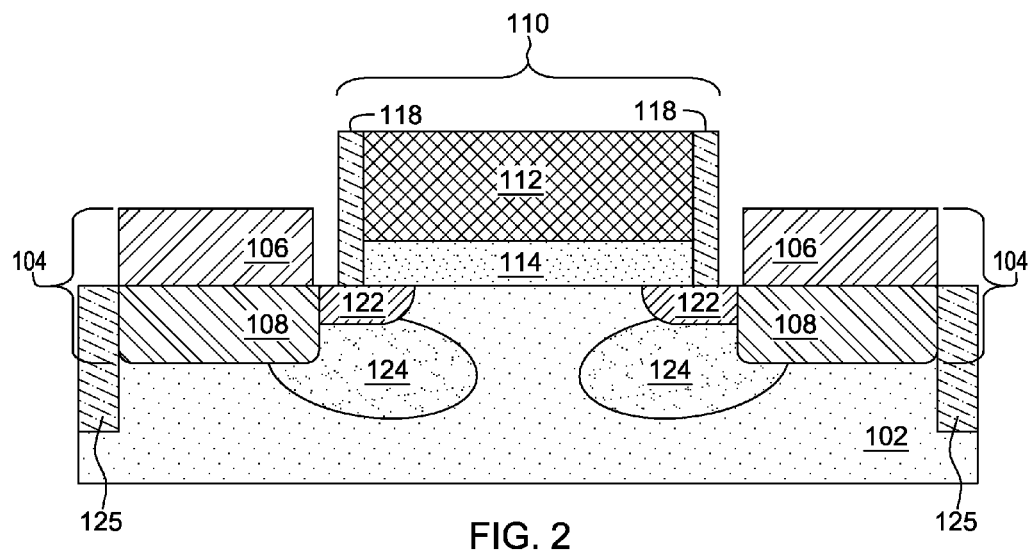
FIG. 2 depicts the removal of an outer region of a dielectric spacer, allowing access to an extension region, in accordance with an illustrative embodiment.

In FIG. 2 an outer region of each spacer 116 is removed to allow access to a portion of the underlying extension regions 122. As previously discussed, in a preferred embodiment, spacers 116 comprise inner spacer 118 and outer spacer 120. This allows for a selective etching process. In the depicted embodiment, the outer region of spacer 116 removed is outer spacer 120.

Figure 3:
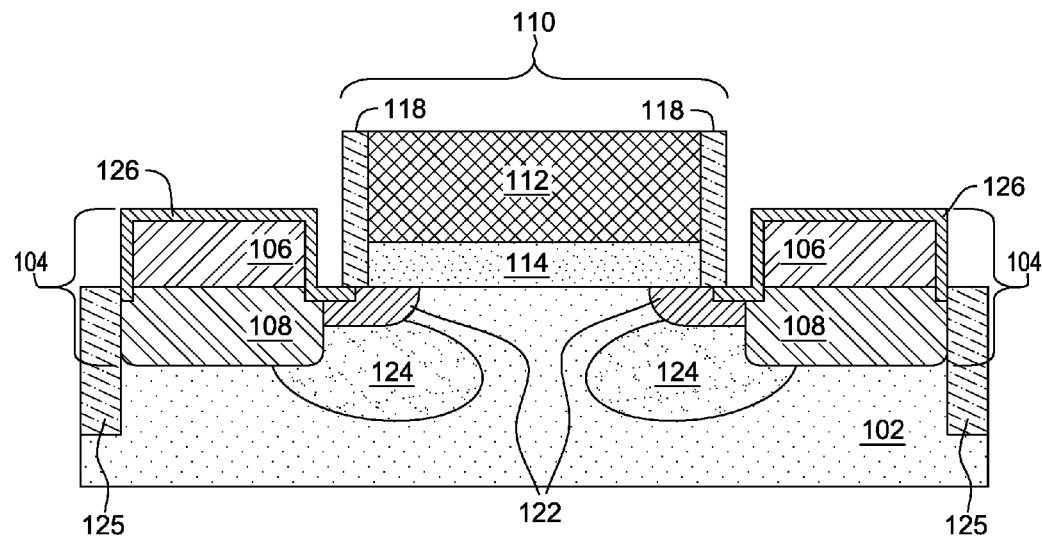
FIG. 3 depicts the forming of a silicide intermix layer on portions of a semiconductor device, in accordance with an illustrative embodiment.

In one embodiment, as depicted in FIG. 3, silicide intermix layer 126 may be formed on portions of a semiconductor device. By "silicide intermix" it is meant that the layer includes metal elements from deposited metal and semiconductor elements from semiconductor substrate 102. Silicide intermix layer 126 forms immediately after a metal layer is deposited on source/drain regions 104 (raised portion 106 in a preferred embodiment) and extension regions 122 within semiconductor substrate 102. Silicide intermix layer 126 is formed without thermal diffusion or an annealing process, which means that silicide intermix layer 126 is formed at room temperature, e.g., 20° C. to 25° C., and at atmospheric pressure, e.g., 1 atm. In silicide intermix layer 126 (the intermixed region) the metal thickness diffusing into silicon is extremely thin, typically in the order of 1 to 3 nm, and only a small portion of the deposited metal becomes part of the intermix layer.

In one embodiment, metal is deposited onto the upper surface of the semiconductor substrate 102, specifically onto source/drain regions 104 and extension regions 122, to form a metal layer. The metal layer may be composed of one or more of nickel (Ni), platinum (Pt), cobalt (Co), titanium (Ti), tungsten (W), rare earth metals (e.g. erbium (Er), ytterbium (Yb)), tantalum (Ta), palladium (Pd), iridium (Ir), and their alloys. The metal layer may be deposited through a variety of techniques, including sputtering, chemical vapor deposition, etc. Silicide intermix layer is formed upon the deposition of this metal. The depth of silicide intermix layer 126 is a function of the thickness of the metal layer deposited and the deposition technique. The formed silicide intermix layer 126 is shallow, preferably no thicker than a 1-2 nm. After silicide intermix layer 126 is formed, the excess metal—deposited metal that has not become part of silicide intermix layer 126—is removed.

In a preferred embodiment, after the excess metal is removed, silicide intermix layer 126 may then be subject to an annealing process (heat treatment). This prevents further diffusion into semiconductor substrate 102 by converting silicide intermix layer 126 into an epitaxial textured silicide, in one embodiment 2-5 nm, that possesses better stability than a monosilicide formed by conventional silicidation. A person of skill in the art will understand that the molar ratio of metal to silicon may have concentrations as high as four to one.

A silicide intermix layer is more thermally stable, and so the silicide-to-junction proximity may be reduced (compared to conventional silicides) for the same junction leakage. This leads to a lesser requirement for larger source/drain regions and therefore a lower gate-to-source/drain capacitance.

Figure 4:
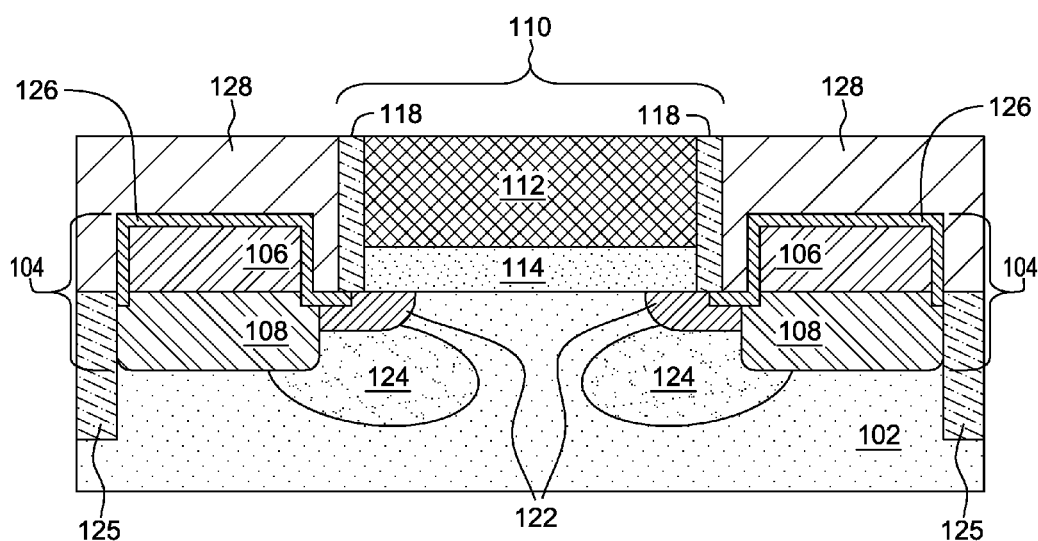
FIG. 4 depicts the depositing of a dielectric material over the silicide intermix layer on top of source/drain regions within the semiconductor substrate, in accordance with an illustrative embodiment.

FIG. 4 shows the depositing of a dielectric material 128 over silicide intermix layer 126 on top of source/drain regions 104. In the depicted example, dielectric material 128 also serves as a replacement to the removed portion of spacer 116. Alternatively, the removed portion of spacer 116, outer spacer 120 in one embodiment, may be replaced prior to the depositing of dielectric material 128.

Figure 5A:
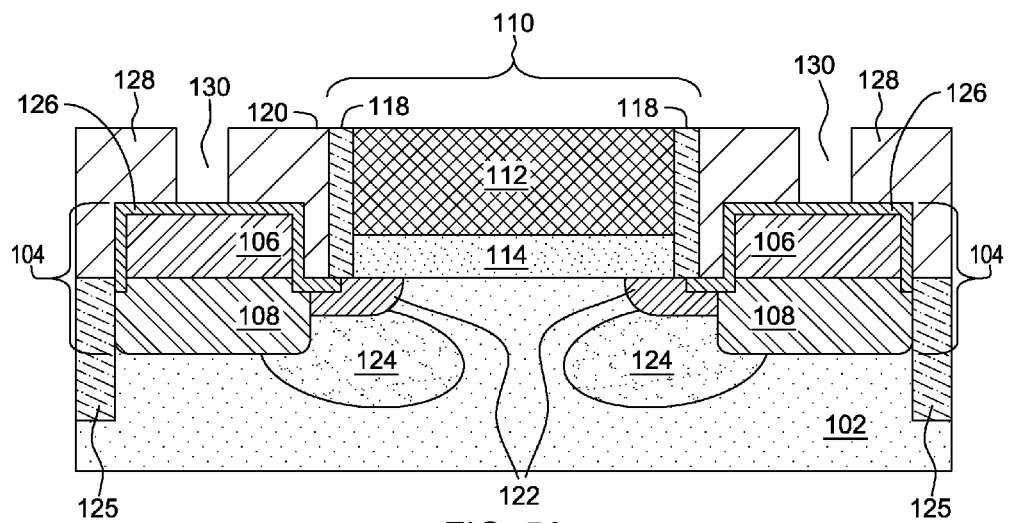
FIG. 5A depicts the creation of a contact opening through the dielectric material, in accordance with an illustrative embodiment.
Figure 5B:
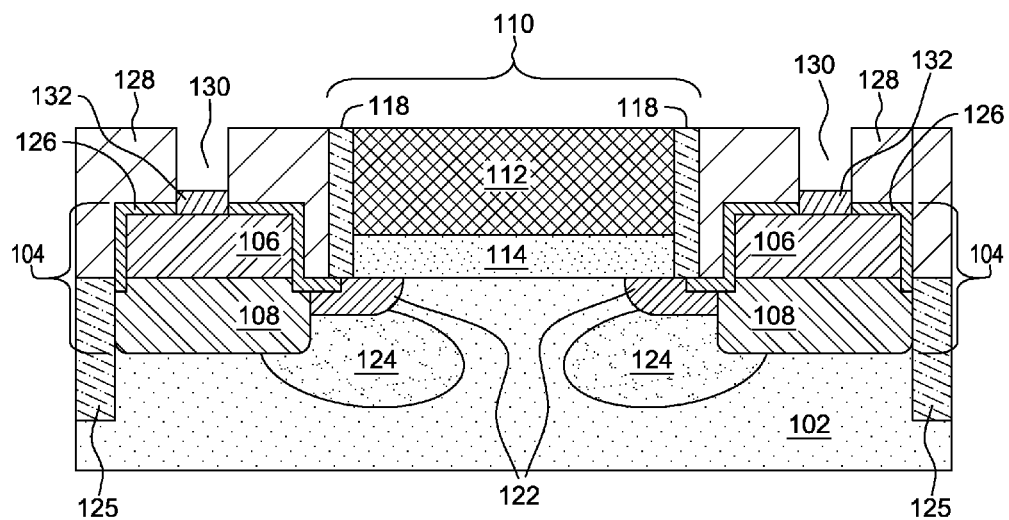
FIG. 5B depicts a silicide contact formed through the silicide intermix layer over the source/drain region, in accordance with an illustrative embodiment.

FIG. 5A depicts the creation of a contact opening 130 through dielectric material 128. Contact opening 130 is created through an etching process which removes an opening from dielectric material 128 and exposes silicide intermix layer 126 on top of source/drain regions 104 (raised portion 106 in a preferred embodiment). In FIG. 5B, a second type of silicide, silicide contact 132 is formed conventionally. Distinguished from a silicide intermix layer, a conventional silicide contact requires thermal diffusion that is induced by annealing metal and semiconductor containing materials that are in contact. In the depicted example, a metal layer is deposited on silicide intermix layer 126 at the bottom of contact opening 130. During the annealing process metal elements from the metal layer are diffused through silicide intermix layer 126 to form silicide contact 132.

Figure 6A:
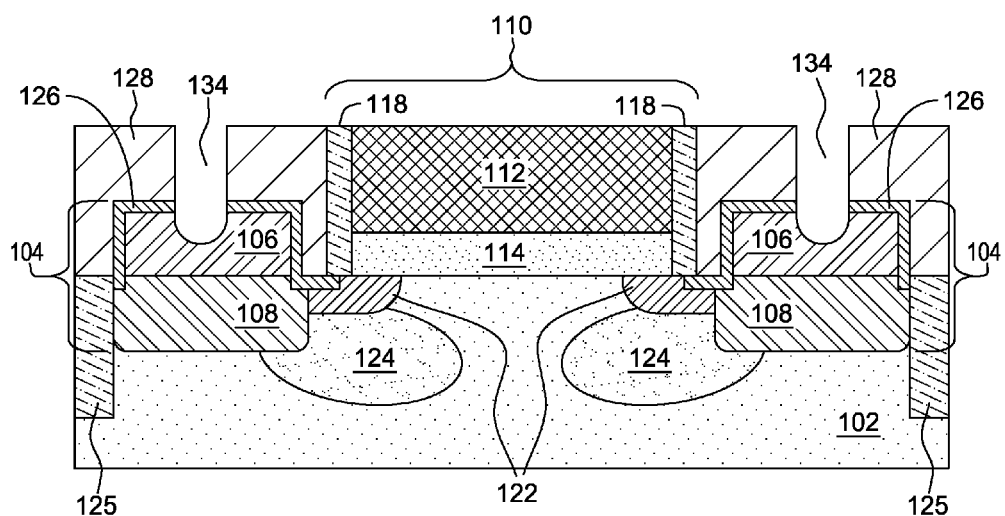
FIG. 6A depicts an alternative creation of a contact opening etched through the dielectric material and the silicide intermix layer and into the source/drain region, in accordance with an illustrative embodiment.

In another embodiment, as depicted by FIG. 6A, an alternative contact opening 134 is etched through dielectric material 128 and silicide intermix layer 126 and into raised portion 106 of source/drain regions 104. Then an alternative silicide contact 136 is formed in FIG. 6B, this time diffusing metal elements through the source/drain region. Silicide contact 136 maintains contact with silicide intermix layer 126 along silicide contact's (136) sides. Alternatively, in FIG. 6C, silicide contact 138 is not created conventionally and instead is formed as a second silicide intermix layer.

Figure 6B:
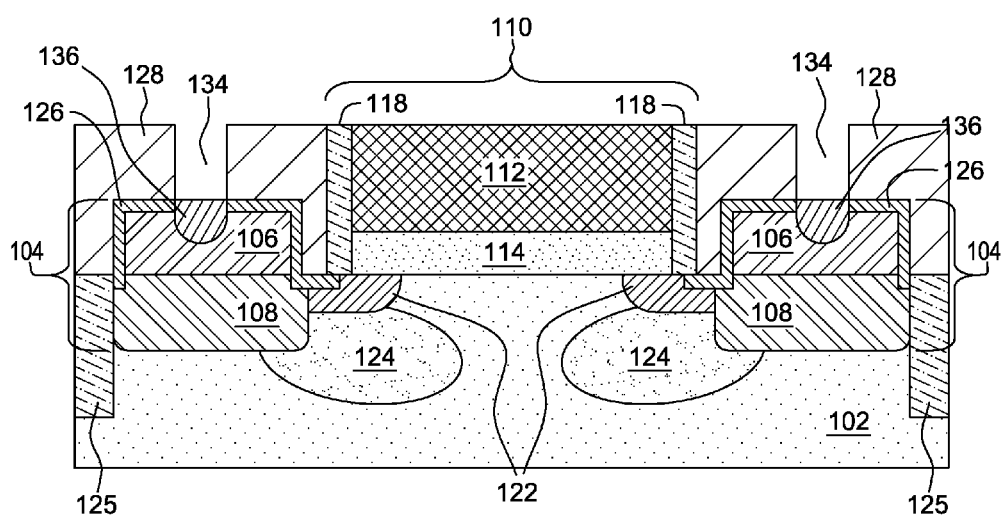
FIG. 6B depicts the silicide contact formed within the source/drain region, in accordance with an illustrative embodiment.
Figure 6C:
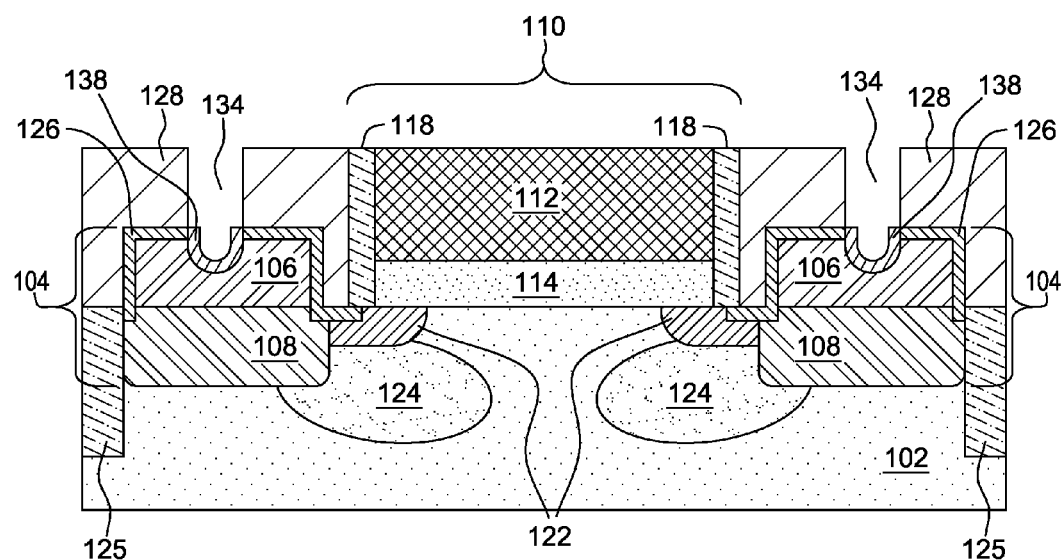
FIG. 6C depicts an alternative silicide contact created as a second silicide intermix layer within the source/drain region, in accordance with an illustrative embodiment.

In a preferred embodiment, as shown in FIGS. 5B, 6B, and 6C, silicide contact (any of 132, 136, and 138) consumes less than the total length across source/drain regions 104 (where the length is depicted in the illustrations as the horizontal distance from one side of a source/drain region to the other side).

FIGS. 5B, 6B, and 6C also depict various embodiments of a semiconductor device comprising a completed two-step silicide formation. A contact may be connected to silicide contact 132, 136, or 138 to transfer current to or from the device.

Figure 7:
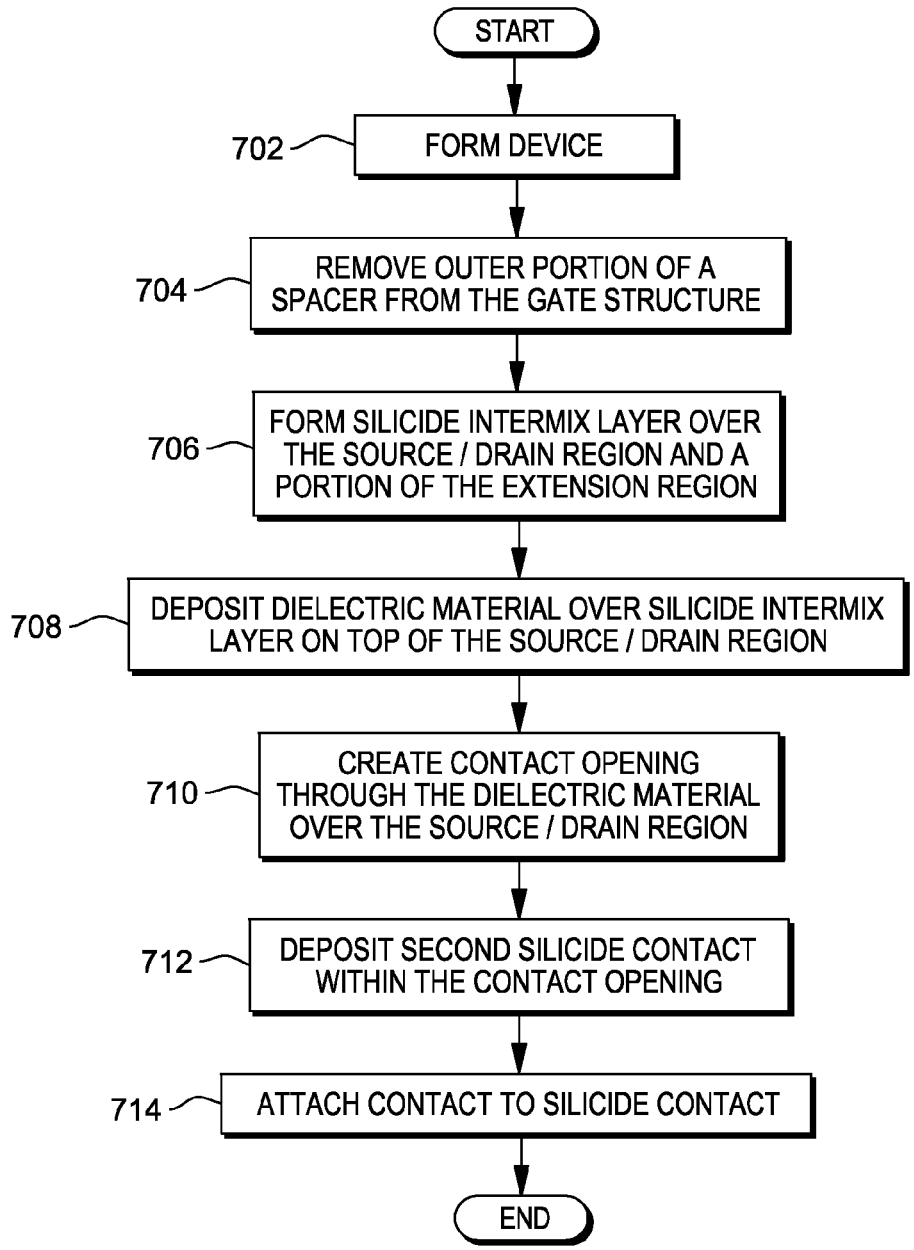
FIG. 7 depicts a flowchart of a method for creating a semiconductor device, in accordance with an illustrative embodiment.

FIG. 7 depicts a flowchart of a method for creating a semiconductor device with a two-step silicide formation.

The first step of the method is to form a device (step 702) on a semiconductor substrate. The device includes a source/drain region, and extension region adjoining the source/drain region and extending toward a gate structure, and the gate structure. The device will preferably include a halo doping region underneath the extension region against the source/drain region junction with the substrate. The source/drain region is preferably a raised source/drain region. Next, remove an outer region of a spacer from the gate structure (step 704) to expose a portion of the extension region. Form a silicide intermix layer over both the source/drain region and the exposed portion of the extension region (step 706). In one embodiment, after forming the silicide intermix layer, the removed portion of the spacer may be replaced. Then deposit a dielectric material over the silicide intermix layer on top of the source/drain region (step 708). Create a contact opening through the dielectric material (step 710) going at least as far down as the silicide intermix layer. In a preferred embodiment, the contact opening will extend past the silicide intermix layer into the source/drain region. Form a silicide contact at the bottom of the contact opening (step 712). In one embodiment a conventional process for creating the silicide contact may be utilized. In another embodiment, the silicide contact may be a second silicide intermix layer. Finally, in a preferred embodiment, attach a contact to the silicide contact (step 714). The contact may be any conductive material.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a semiconductor device with a two-step silicide formation for reducing parasitic source/drain resistance and gate-to-source/drain capacitance in integrated circuit devices (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method for forming a semiconductor device, the method comprising the steps of:
   providing a transistor comprising a source/drain region within a substrate, an extension region within the substrate adjoining the source/drain region and extending toward a gate on the substrate, and a dielectric spacer against the gate wherein the dielectric spacer covers at least part of the extension region;
   depositing a metal layer over both the source/drain region and a portion of the extension region which is not covered by the dielectric spacer such that metal from the metal layer diffuses into the source/drain region and the portion of the extension region to form, without a thermal anneal, a silicide intermix layer having a thickness no greater than 3 nm;
   removing metal, from the metal layer, that has not diffused into the source/drain region and the portion of the extension region;
   depositing dielectric material over the silicide intermix layer on top of the source/drain region;
   creating a contact opening through the dielectric material, wherein the contact opening extends at least as far as the silicide intermix layer over the source/drain region; and
   forming a silicide contact at the bottom of the contact opening.

2. The method of claim 1, further comprising the step of removing an outer region of the dielectric spacer to expose part of the extension region.

3. The method of claim 2, wherein the dielectric spacer comprises an inner spacer against the gate and outer spacer, and wherein the outer region removed is the outer spacer.

4. The method of claim 3, further comprising the step of:
   after forming the silicide intermix layer and before the step of depositing the dielectric material, replacing the outer spacer.

5. The method of claim 1, wherein the step of forming the silicide contact at the bottom of the contact opening comprises the silicide contact consuming less than a length of the source/drain region.

6. The method of claim 1, further comprising the step of:
   after removing the metal that has not diffused into the source/drain region and the portion of the extension region, performing an annealing process on the silicide intermix layer.

* * * * *